United States Patent
Ishihara

[11] Patent Number: 6,156,646
[45] Date of Patent: Dec. 5, 2000

[54] METHOD OF MANUFACTURING SEMICONDUCTOR DEVICES

[75] Inventor: Yukihiro Ishihara, Kanagawa, Japan

[73] Assignee: Fujitsu Limited, Kawasaki, Japan

[21] Appl. No.: 09/159,650

[22] Filed: Sep. 29, 1998

[30] Foreign Application Priority Data

Feb. 19, 1998 [JP] Japan ................................ 10-037780

[51] Int. Cl.$^7$ ........................ H01L 21/4763; H01L 21/44
[52] U.S. Cl. ........................ 438/652; 438/627; 438/643; 438/648; 438/688; 438/636; 438/646
[58] Field of Search ................................ 438/627, 652, 438/643, 648, 688, 636, 646, 661

[56] References Cited

U.S. PATENT DOCUMENTS

| | | | |
|---|---|---|---|
| 5,665,659 | 9/1997 | Lee et al. ................................ | 438/646 |
| 5,702,564 | 12/1997 | Shen .................................... | 156/643.1 |
| 5,736,458 | 4/1998 | Teng ...................................... | 438/627 |
| 5,807,760 | 9/1998 | Buckfeller et al. ....................... | 437/187 |

*Primary Examiner*—Carl Whitehead, Jr.
*Assistant Examiner*—James Park
*Attorney, Agent, or Firm*—Armstrong, Westerman, Hattori, McLeland & Naughton

[57] ABSTRACT

A method of manufacturing a semiconductor device is provided in which a well patterned lead line structure is obtained. In one aspect of the invention, the method comprises steps of:

depositing on a semiconductor wafer a metal layer for forming lead lines at a first predetermined temperature of about 400° C., say; and depositing an anti-reflective layer on the metal layer in the following multi-deposition steps:

step 1: a thin anti-reflective layer is deposited on the metal layer near the first predetermined deposition temperature;

step 2: the metal layer is cooled to a second predetermined deposition temperature of about 150° C., say while interrupting the deposition of the anti-reflective layer; and step 3: the anti-reflective layer is grown to a predetermined thickness by resuming the deposition thereof at the second predetermined deposition temperature.

10 Claims, 6 Drawing Sheets

METHOD OF MANUFACTURING SEMICONDUCTOR DEVICES

FIELD OF THE INVENTION

The invention relates to a method of manufacturing a semiconductor device, and more particularly, to a method of forming a multi-level lead line structure for use in semiconductor devices including memory devices and logic devices.

BACKGROUND OF THE INVENTION

Multi-layer wiring technology has become increasingly more important in semiconductor device industries in forming integrated circuits (ICs) and large-scale integrated circuits (LSIs) in order to allow for high density integration and a great freedom for electric connection of the elements in these ICs and LSIs. In fact, as the dimensions of the elements of a chip are reduced to increase their density on a given substrate, lead lines tend to occupy a large percentage of the total area available on the chip, which sometimes amounts to as much as 20–30 percent of the total areas. However, the widths of the lead lines cannot be decreased arbitrarily because lead lines are required to have sufficient current capacities or are limited electric resistance below a required level. Thus, a multi-level lead line structure is a very promising solution to this problem.

The advantage of the multi-level lead line structure apparently lies in the fact that that it does not require wiring spaces between the elements on an IC chip, thereby increasing the density of the elements on the chip and minimizing the total size of the chip. The multi-level lead line structure may also increase a freedom in patterning the lead lines and hence provide ease of setting up the lead lines satisfying electric capacity-resistance requirements.

Figure 1:
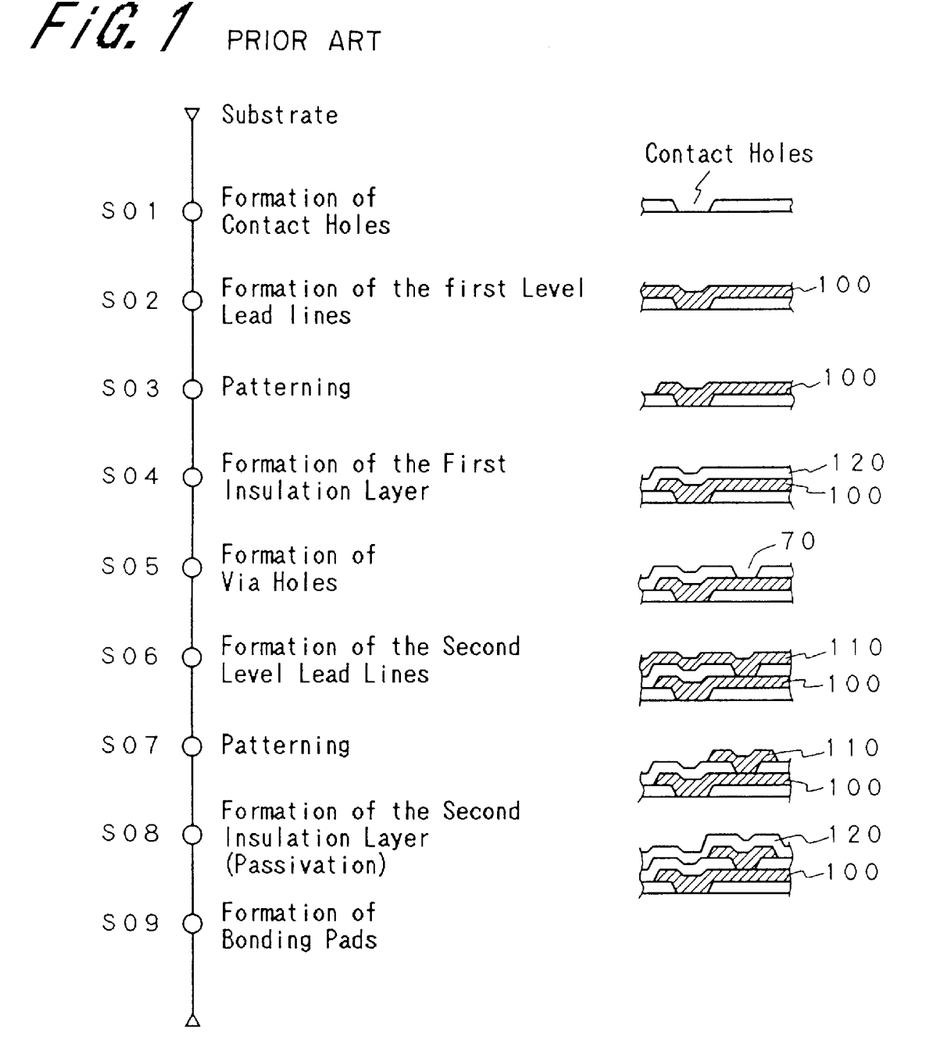
FIG. 1 is a schematic view illustrating a conventional method of manufacturing a semiconductor device.

FIG. 1 illustrates in step a typical procedure for manufacturing the most fundamental multi-level lead line structure, i.e. a double-layer lead line structure. In step S01 a substrate having thereon semiconductor elements is provided. Contact holes for connection of the elements with first level lead lines are formed in the substrate.

In step S02 a first metal layer is formed for the first level lead lines. Typically, aluminum or aluminum alloy is used for the metal layer, but other metals such as copper (Cu), molybdenum (Mo), tungsten (W), silicide, titanium (Ti), paradium (Pd), platinum (Pt), and gold (Au) may be used equally well for the metal layer as needed.

In step S03 the first metal layer is processed by a known lithographic method, resulting in the first level lead lines. The first level lead lines may be alternatively formed by providing appropriated metal lead wires without using a lithographic method.

In step S04, a first insulation layer is formed on the first level lead lines. If the first metal layer is aluminum, $SiO_2$ is the best insulating material from the point of amenity with the aluminum lead lines. Although sputtering methods were popular in the formation of insulating oxide layers in early stages of the development of multi-layered LSIs, it is now customary to use a low-temperature CVD method using $SiH_4$ in the formation of oxide layers. Phosphorous glass (PSG) and plasma $Si_3N_4$ are also commonly used.

In step S05, via holes are formed in the first insulation layer.

In step S06, a second metal layer is formed for second level lead lines, using essentially the same material as for the first metal layer.

In step S07, the second metal layer is patterned and processed by a known lithographic technique to form the second level lead lines.

In step S08, a second insulation layer is formed on the second level lead lines such that the insulation layer provides passivation function. The second insulation layer is made of essentially the same material as the first insulation layer.

In step S09, appropriate bonding pads are formed in accordance with the wiring technique used.

The steps SO1 through SO9 as shown in FIG. 1 provide a double layer lead line structure. In the case of a three-layer lead line structure, the step S05 for forming via holes through the step S08 for forming a further insulation layer are repeated for the third level lead lines.

The metal layers are required to have such material properties as ability to provide sufficient step coverage, low resistivity, good ohmic contact with silicon and aluminum, adhesivity to an underlying insulation layer of $SiO_2$, ease of lithographic processing, uniformity and homogeneity when formed in the form of a thin layer, and chemical and thermal stabilities that may prevent electromigration.

The insulation layers are required to have such properties as ability to provide sufficient step coverage, high electric insulation, adhesivity to metals, inertness to metals, ease of lithographic processing, homogeneity and uniformity when formed in the form of a thin layer, having little pin-holes and cracks, chemical and thermal stabilities, ease of low-temperature deposition, and good passivation characteristic against any contamination.

In steps S03 and S07, the first and the second metal layers of aluminum or aluminum alloy are fabricated to form the first and the second level high density lead lines, respectively, by irradiating light beams on the photoresists to harden or dissolve the photoresists. The light beams, however, can be reflected by the respective underlying metal layers and further harden or dissolve the photoresists, which makes it difficult to carry out fine patterning of the metal layers for the lead lines.

Therefore, in order to prevent such reflection of light, each of the metal layers is generally applied thereto with an anti-reflective film, which is typically TiN (hereinafter referred to as anti-reflective TiN or ARC-TiN). Steps S02 and S07 for forming metal layers and subsequent steps for forming ARC-TiN layers as shown in FIG. 1 are carried out continuously in an evacuated chamber.

In order to meet growing demands for highly integrated, high-density semiconductor devices, requirements for fabricating a multi-level lead line structure have become more stringent. The requirements include sufficiency of step coverage of via holes (contact holes) having high aspect ratio (which is defined by a ratio of transverse size to the longitudinal size of a via hole). In order to provide sufficient step coverage of via holes, it is necessary to grow the metal layer at a temperature at about 400° C. or higher so that the aluminum or aluminum alloy layer maintains sufficient fluidity for the coverage.

However, if the temperature of 400° C. or higher is maintained while depositing the anti-reflective TiN layer, a problematic ring shaped etch residues result. This is because the metal layers and the anti-reflective TiN layers have different thermal expansion coefficients. For example, aluminum has a thermal expansion coefficient of $2.3 \times 10^{-5}$/deg at 293° K., which is greater than the thermal expansion coefficient, $0.7 \times 10^{-5}$/deg, of TiN. As a consequence, if the metal layers and the anti-reflective TiN are formed at 400° C. or above and then cooled to a room temperature, cracks will be generated in the TiN layer due to larger contraction of the metal layer than that of the anti reflective layer. When the anti-reflective TiN layer is then patterned and etched, the cracks will result in ring shaped faults on the substrate, as described below.

This ring shaped fault problem has been discussed by I. G. Colgan et al. in detail in Proc. 11th VMCC Conf., pp. 284–286, June 1994, which is hereby incorporated by reference into this disclosure.

Figure 2A:
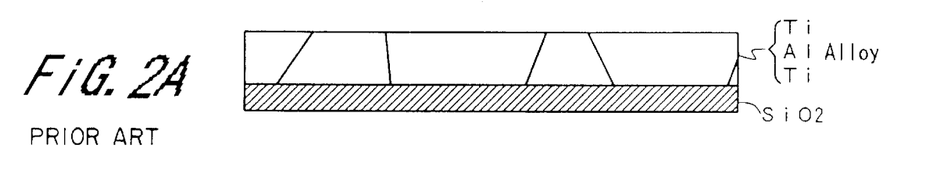
FIGS. 2(A)–2(D) are illustrations of a ring shaped fault.

It is shown in FIG. 2A that a metal layer consisting of Ti/AlCu(Aluminum alloy)/Ti (referred to as "TAC structure") is provided on an underlayer of $SiO_2$. The metal layer is formed by sequentially depositing a Ti layer, an Al alloy layer such as AlCu, and another Ti layer at an elevated temperature. Because of the elevated temperature, Aluminum has relatively large grains.

Figure 2B:
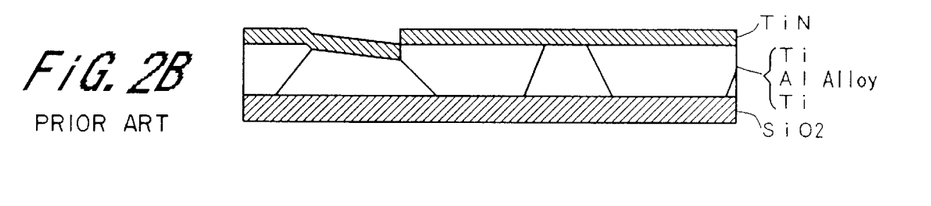

As shown in FIG. 2B, the deposition of the Al alloy is followed by the deposition of an ARC-layer of TiN, which is subsequently cooled to a room temperature. In this case, since there is a tensile stress in the Al alloy layer, the ARC-TIN layer on the Al alloy layer is cracked due to grain collapse under the tensile stress, result in grooves or holes in the ARC-TiN layer.

Figure 2C:
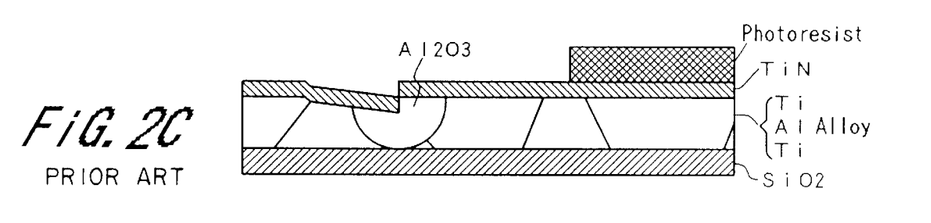

In the next step, the substrate is subjected to a sequence of lithographic processes which includes application of a photoresist onto the ARC-TiN layer, irradiation of light, development, and rinsing, as shown in FIG. 2C. The development is done by a developing liquid such as TMAH (tetramethylammoniumhalide). The TMAH will infiltrate into the holes in the ARC-TiN and etches the aluminum alloy, so that $Al_2O_3$ (alumina) is formed in the subsequent rinse process.

Figure 2D:
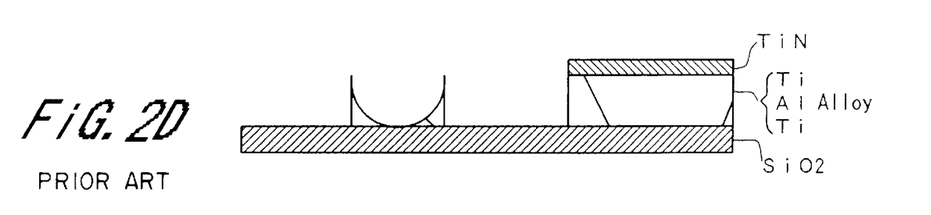

In the etching process as shown in FIG. 2D, the $Al_2O_3$ works as an etching mask to leave ring shaped etch residues of Al alloy. The size of such a ring shaped etch residue depends on the development time and the size of the hole, with a larger etch residue for a longer development time and for a larger hole. Such ring shaped residues result in ring faults of lead lines.

Therefore, in order to prevent the ring faults arising from the cracks due to mismatch of thermal expansion coefficients of the Al alloy layer and the ARC-TiN layer, it is necessary to form the ARC-TiN layer at or below 150° C. after the formation of the Al alloy layer at or above 400° C.

However, if the anti reflective layer of TiN is deposited on the Al alloy layer at or below 150° C. immediately after the deposition of the Al alloy layer at or above 400° C., the underlying Al alloy layer is rapidly cooled to shrink, thereby generating grain boundaries in the Al alloy layer.

By grain boundaries we mean interfaces between individual crystalline structures (crystalline grains) in a solid. Metals such as aluminum may have crystalline structures which are defined precisely in terms of three dimensional periodic arrangement of atoms (or ions). The direction of a crystalline structure is characterized by a set of crystal axes. The individual crystalline grains have the same crystalline structure, but their crystal axes are oriented in different directions. Thus, the grain boundaries may be viewed as lattice imperfections that appear in the form of interfaces between two neighboring crystals.

If the grain boundaries are formed by quick thermal contraction of the Al alloy layer, deep grooves are formed in the surface of the Al alloy along the grain boundaries. Since the ARC-TIN layer is then formed over the Al alloy surface having such deep grooves, the surface of the TiN layer has extremely poor flatness. That is, the TiN layer has discontinuities. If such TiN layer is lithographically processed, the TiN layer is patterned in an undesirable configuration, leaving etch residues at the discontinuities and the grain boundaries, which cause insufficient insulation in the underlying lead lines.

As described above, the deposition of the ARC-TiN layer at the same high temperature as the deposition of the metal layer such as aluminum or aluminum alloy entails an impediment of ring shaped faults caused by cracks and holes. If, on the other hand, the ARC-TIN layer is deposited at a lower temperature in an attempt to overcome this problem, the Aluminum or Aluminum alloy layer is rapidly cooled and suffers from grooves in the layer and surface discontinuities, which in turn result in etch residues and undesirable patterns of the underlying layer as mentioned above and hence unsatisfactory insulation of the lead lines.

SUMMARY OF THE INVENTION

It is, therefore, an object of the present invention to provide a novel method of manufacturing semiconductor devices.

It is another object of the present invention to provide a novel method of manufacturing semiconductor devices, in which a desirable lead line structure may be fabricated.

It is another object of the invention to provide a method of manufacturing semiconductor devices having good lead line insulation by providing a planarized lead line layer on a semiconductor substrate and hence substantially minimizing ring faults and etch residues thereon, thereby allowing for a well patterned and well insulated lead lines on the substrate.

In accordance with one aspect of the present invention, there is provided a method of manufacturing a semiconductor device having a multi-level lead line structure, comprising steps of:

depositing at a first temperature a metal layer for forming lead lines;

depositing on said metal layer an anti-reflective layer under a temperature gradient that decreases in the direction of the thickness of said anti-reflective layer such that the temperature of said anti-reflective layer adjacent said metal layer is substantially the same as said first deposition temperature, and is the same as a second predetermined deposition temperature which is lower than said first deposition temperature.

In accordance with another embodiment of the invention, there is provided a method of manufacturing a semiconductor device having a multi-level lead line structure, comprising steps of:

depositing at a first deposition temperature a metal layer for forming a lead line layer, and depositing an anti-reflective layer on said metal layer, wherein substantially no thermal stress due to temperature gradient is left in the interface region between said metal layer and said anti-reflective layer.

In accordance with yet another embodiment of the invention, there is provided a method of manufacturing a semiconductor device having a multi-level lead line structure, comprising step of:

depositing at a first deposition temperature a metal layer on a semiconductor wafer for forming a lead line layer; and depositing an anti-reflective layer on the metal layer in the following three steps:

step 1: a thin anti-reflective layer is deposited at the first predetermined deposition temperature on the metal layer;

steps 2: the metal layer bearing thereon the thin anti-reflective layer is cooled while interrupting or retarding the deposition of the anti-reflective layer until the metal layer is cooled to a second predetermined deposition temperature; and step 3: the anti-reflective layer is grown to a predetermined thickness by resuming the deposition at the second predetermined deposition temperature.

In this method of manufacturing semiconductor devices, the steps of depositing the anti-reflective layer is carried out by means of Ar assisted sputter processing such that;

Ar gas is stopped on the heating side of the wafer in the step I of depositing the thin anti-reflective layer;

Ar gas is flown only on the heating side of the wafer in the step 2 of cooling of the metal layer to the second predetermined deposition temperature; and Ar gas are flown on the processing and heating sides of the wafer, respectively, in the step 3.

More particularly, the first deposition temperature in the formation of the metal layer is preferably about 400° C. and the second predetermined deposition temperature in the formation of the anti-reflective temperature is preferably about 150° C.

The metal layer may be aluminum or aluminum alloy, while the anti-reflective layer may be TiN.

By forming the anti-reflective layer in multiple steps at different temperatures, formation of grooves in the metal layer, and hence ring shaped faults also, may be prevented to occur.

DETAILED DESCRIPTION OF THE PREFERRED EMBODIMENT

Preferred embodiments of the invention will now be described in conjunction with the accompanying drawings, in which like reference numerals indicate like or corresponding parts throughout the figures.

[Method of Manufacturing a Semiconductor Device]
(Overall of the Manufacturing Method)

Figure 3A:
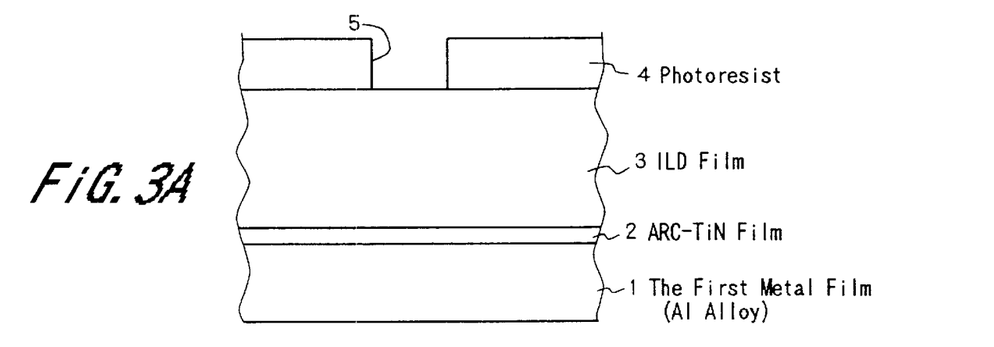
FIGS. 3(A)–3(C), and 4(A)–4(C) together illustrate a method of manufacturing a semiconductor device according to the invention.
Figure 3B:
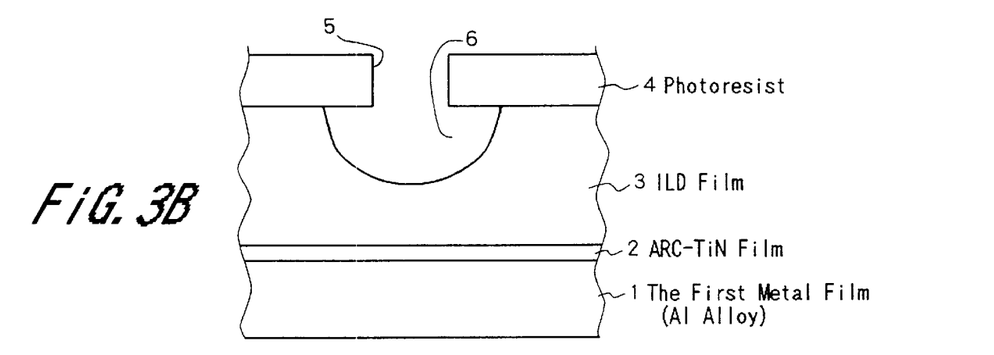
Figure 3C:
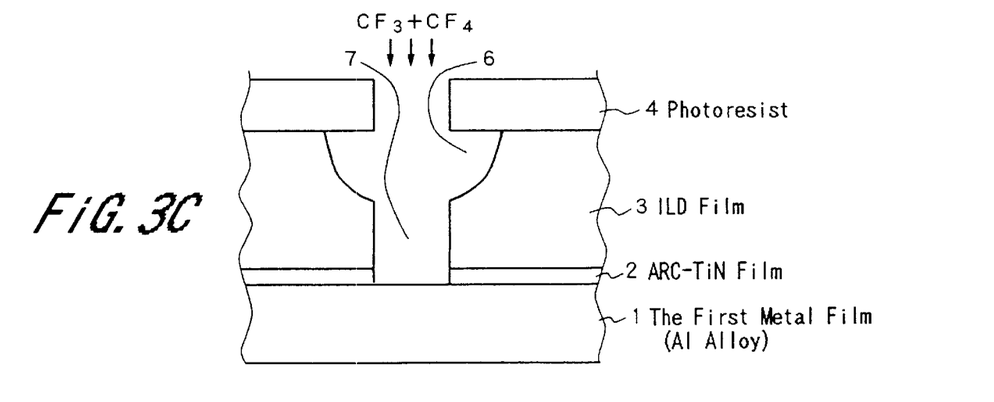
Figure 4A:
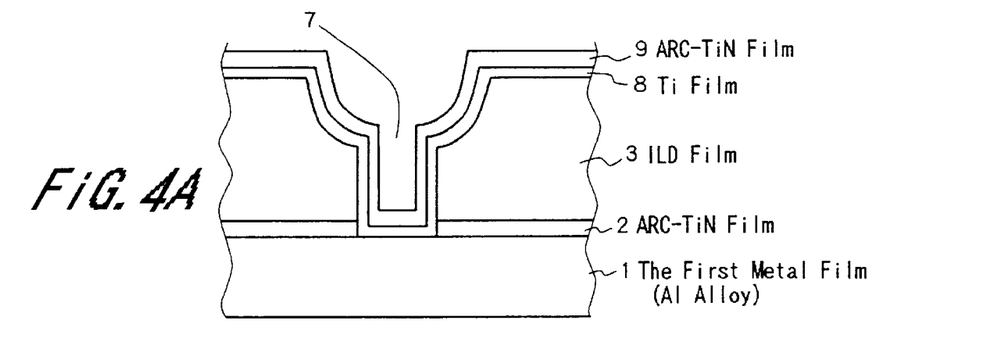
Figure 4B:
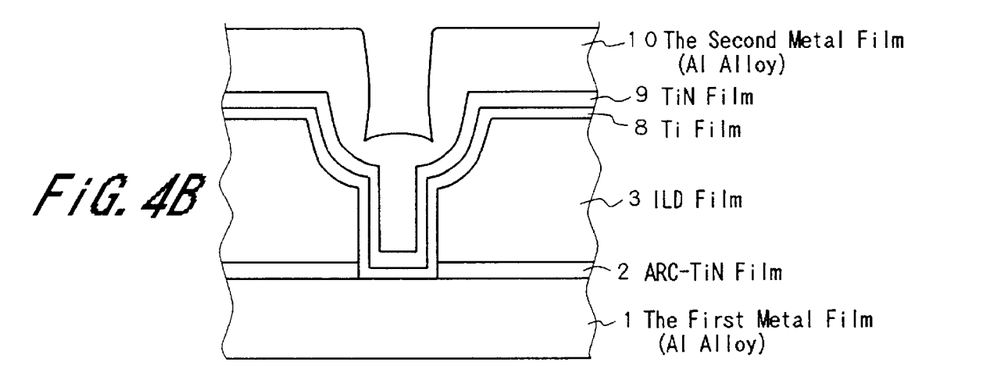
Figure 4C:
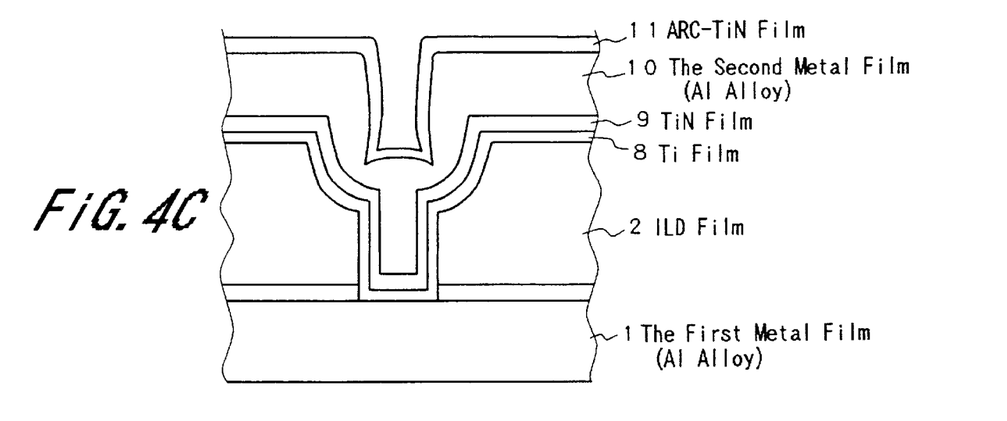

Referring now to FIGS. 3 and 4, there is shown in step a method of manufacturing a semiconductor device according to the invention.

A semiconductor device such as a memory device and a logic device in the form of IC and LSI includes a plurality of semiconductor elements formed on one chip. In general, a first level of a multi-level lead line structure is formed of over the semiconductor elements for connecting the elements with one another and/or with terminals for connection with external lead wires. At first, an underlayer such as PSG (phospho-silicate glass) is deposited over the semiconductor elements.

Then, a first metal lead line layer 1 is deposited on the underlayer as shown in FIG. 3A. This metal layer 1 is typically aluminum or aluminum alloy, but it is not limited to them. It can be Cu, Mo, W, silicides, Ti, Pd, Pt, or Au, as is used in prior art. In the example shown herein the metal layer is formed at about 400° C. using of an aluminum alloy which contains 0.5% of Cu(i.e. Al-0.5%Cu).

Deposited on the first metal layer 1 is an ARC-TiN layer 2 using "a multi-step deposition technique" as described in detail later. The TiN layer 2 serves not only as an anti-reflective layer but also as a layer to prevent stress migration. Since the multi-step deposition technique is also applied to the deposition of another ARC-TiN layer on a second metal layer in a subsequent process, the multi-step deposition technique will be described in detail later.

The first metal layer 1 and the ARC-TiN layer 2 are patterned to provide a first lead lines by means of a known lithography technique. In stead of using the metal layer to form the first level lead lines, Ta wires for example may be alternatively used. Next, an insulation layer 3 is deposited on the ARC-TiN layer 2. In order to secure amenity of the insulation layer 3 with the aluminum or aluminum alloy layer with the ARC-TiN layer, it is typically a low temperature CVD oxide layer such as $SiO_2$ layer or $SiH_4$ layer. PSG or plasma $Si_3N_4$ may be also used as needed for this purpose.

A photoresist 4 is applied onto the insulation layer 3. The photoresist 4 is then optically processed and developed to define generally round openings or via holes 5 in the first metal layer 1 as shown in FIG. 3A.

Next, using this photoresist 4 having the openings 5 as a mask, the upper portion of the insulation layer 3 is subjected to isotropic wet etching using an appropriate fluoride etchant, so that bowl-shaped recesses 6 are formed in the insulation layer 3, as shown in FIG. 3B. The recesses 6 may be formed by plasma etching using $CF_4$ and $O_2$ as an etchant gas. The openings 6 are bowl-shaped to improve coverage by the second metal layer of via holes formed in subsequent processes.

Next, as shown in FIG. 3C, a photoresist 4 is again used to mask the insulation layer 3 to further dry-etch the insulation layer 3 by a reactive ion etching process, using for example $CF_3$ or $CF_4$ as an etchant gas, so that cylindrical openings or via holes 7 at the bottoms of the openings 6 are formed for partially exposing the first metal layer 1.

The remaining photoresist 4 is removed by dissolving it with an adequate solvent, as shown in FIG. 4A. Then the oxide layer which is formed naturally on the surface on the first metal layer 1, is removed in a further dry etching process in vacuum using RF etching. A Ti layer 8 is deposited to a thickness of about 20 nm on the exposed areas of the first metal layer 1 and the inner surfaces of the via holes 6 and 7, and over the surface of the insulation layer 3 as well. The Ti layer 8 is provided to reduce electric contact resistance between the first metal layer 1 and the second metal layer which is formed over the first lead line layer 1 later. Another TiN layer 9 is then formed on the Ti layer 8 to a thickness of about 100 nm to prevent contact migration.

As shown in FIG. 4B, the second metal layer 10 is formed on the TiN layer 9 to a thickness of about 900 nm. The second metal layer 10 can be of the same material as the first metal layer 1. In the example shown herein, Al alloy containing 0.5% of Cu is used for the second metal layer. In order to obtain desirable coverage of the via holes 7, the layer 10 is formed at about 400° C.

Next, a further ARC-TiN layer 11 is formed on the second metal layer 10 to a thickness of about 50 nm, as shown in FIG. 4C. The ARC-TiN layer 11 is formed, not continually at a constant temperature but in a few separate steps by a multi-step deposition method, as described below.

[Multi-Step Deposition Method]

The multi-step deposition method, used in depositing the ARC-TiN layers 2 and 9 for the first and the second metal layers 1 and 10 comprises the following three steps.

(1) Step 1: partial deposition of the ARC-TIN layer on a metal layer of a semiconductor wafer at substantially the same temperature (i.e. the first predetermined deposition temperature) as that of the metal layer deposition.

Ar assist gas is generally supplied from two gas inlets to a sputtering chamber of a sputtering equipment, one is for introducing Ar gas against the rear side of a semiconductor wafer by positioning one inlet in a neighboring region of a heater for heating the wafer, the other is introducing Ar gas against the front side of a semiconductor wafer by positioning the other inlet in a sputtering process region above the semiconductor wafer. In such sputtering equipment, in order to maintain the temperature of the metal layer, the Ar gas on the heating side is cut off, thereby a temperature gradient across the interface between the metal layer and the ARC-TiN layer can be suppressed.

(2) Step 2: Interruption of the ARC-TiN layer deposition to cool the metal layer to a second predetermined deposition temperature.

In this cooling step, Ar gas is stopped on the processing side and is allowed to flow only on the heating side.

(3) Step 3: Resumption of the ARC-TiN layer deposition to a predetermined thickness at the second predetermined deposition temperature.

In this step, Ar gas is supplied on the processing side as well as on the heating side.

As discussed previously, deep grooves are formed along the grain boundaries of the metal layer due to rapid contraction of the metal layer such as Al or Al alloy when it is cooled quickly from the high metal deposition temperature to a room temperature because of its relatively large thermal expansion coefficient. However, the inventors have found that the generation of the grooves can be suppressed by pre-depositing a thin layer of ARC-TiN at the metal deposition temperature prior to growing the remaining portion of the layer at a late time.

The inventors have also found that, by depositing the remaining portion of the ARC-TiN layer at about 150° C. or below, it is possible to prevent cracking and ring faults in the metal layer as observed in conventional methods. It would be recalled that such faults are induced if the ARC-TiN layer is formed continually on the metal layer, causing the metal layer to be cooled rapidly from a high metal deposition temperature to a low TiN layer deposition temperature.

(Temperature Change)

Figure 5:
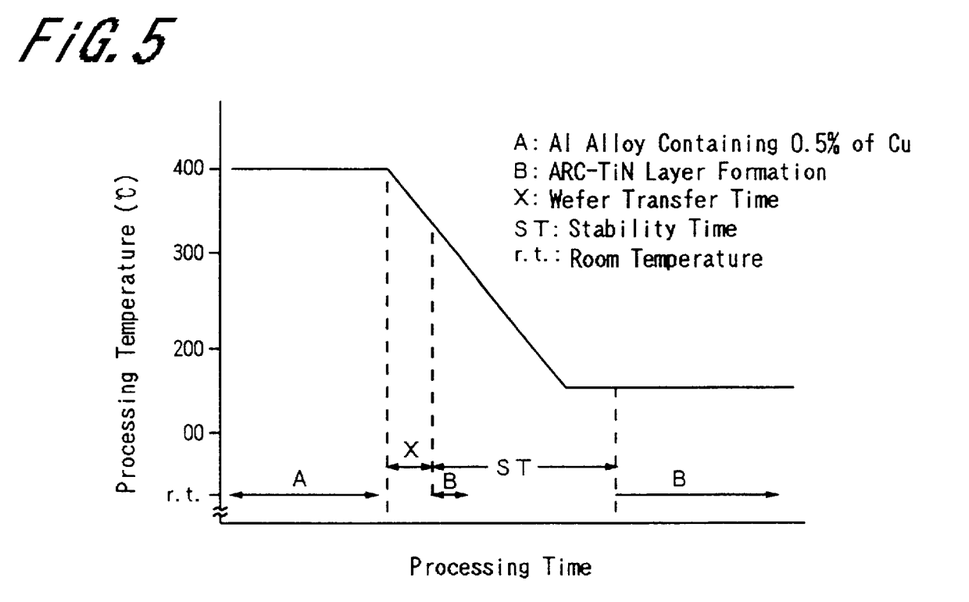
FIG. 5 illustrates a multi-step deposition method of the invention for manufacturing a semiconductor device.

FIG. 5 is a graph of the processing temperature (° C.) observed in the multi-step-deposition of a metal layer (in step "A") and an ARC-TiN layer (in step "B"), plotted against the processing time.

As shown in FIG. 5, the metal layer is grown in step "A" to a desired thickness on a semiconductor wafer in a metal layer deposition chamber at a first deposition temperature to secure sufficient coverage of the via holes therein. In this example the metal layer is aluminum alloy containing 0.5% of Cu. The first deposition temperature is about 400° C. and the thickness of the metal layer is about 900 nm.

Next, the semiconductor wafer is transferred into an anti-reflective layer deposition chamber in a shortest possible time interval "X" so that the wafer is coated with an anti-reflective layer in the chamber before the wafer is cooled appreciably. This time interval "X" is referred to as transfer time.

On the semiconductor wafer, now transferred in the chamber, ARC-TiN is immediately deposited only to a small fraction of the predetermined total thickness thereof at about the first predetermined deposition temperature.

This step corresponds to the step 1 of the multi-step deposition. In the example shown herein the desired total thickness of the ARC-TiN is about 50 nm, and the first predetermined deposition temperature is about 400° C. The wafer is kept near the first deposition temperature during this ARC-TiN deposition process. As the thickness of the ARC-TiN layer reaches about 10 nm, the deposition is interrupted for a moment. In the step 1 of the deposition process, substantially no thermal stress due to temperature gradient is left across the interface region between the metal layer and the ARC-TiN layer.

In the next step, the wafer is cooled to a second predetermined deposition temperature which is adequate to resume deposition of the ARC-TiN layer without generating cracks in the ARC-TiN layer, so that no hole or ring faults arises from the cracks.

This cooling step corresponds to the step 2 of the multi-step deposition procedure. In the example shown herein, the second predetermined deposition temperature is about 150° C. and the cooling time is about 60 seconds, as shown in FIG. 5. The metal layer is gradually cooled to this temperature. The cooling time is referred to as gas temperature stabilized time or stability time (ST).

Next, the ARC-TiN is further deposited at this temperature until the thickness of the ARC-TiN layer reaches the predetermined thickness, when the deposition of the anti-reflective layer is ended.

This step corresponds to the step 3 of the multi-step deposition procedure. In the example shown herein, the ARC-TiN layer is increased in thickness by about 40 nm at about 150° C., resulting in the final thickness of about 50 nm.

The multi-step deposition procedure is essentially different from conventional deposition procedures in that a temperature gradient is given in the ARC-TiN layer along the thickness of the ARC-TiN layer over the first and the second predetermined deposition temperatures, rather than giving a substantial temperature gradient in the region of the metal layer neighboring to the ARC-TiN layer, and that no thermal stress due to temperature gradient remains across the interface between the metal layer and the anti-reflective layer.

The effects of such temperature gradient on the metallography of the ARC-TiN layer has not been fully analyzed. However, the multi-step deposition procedure for the ARC-TiN layer may attain anticipated suppression of cracks, holes, and grooves caused by rapid thermal contraction of the Al layer, and hence suppression of the ring faults, as verified below. In addition, it has been verified that the multi-level lead lines thus formed have satisfactory characteristics for a semiconductor device.

[Evaluation of Manufactured Semiconductor Devices]

Table 1 compares a semiconductor device manufactured by the multi-step deposition procedure and of a device manufactured by a conventional single-step deposition procedure, regarding the formation of an anti-reflective layer. Patterning and etching conditions are the same for all the devices listed.

(Single-Step Deposition Procedure)

Included in Table 1 are three cases of the single-deposition procedure for three different temperature stabilized times, ST=5, 15, and 40 seconds. Tests were performed for the three cases because the generation of ring faults and grooves were suspected to depend on the cooling time subsequent to the deposition of the metal layer in the conventional single-step deposition procedure.

These temperature stabilized times indicate the cooling times subsequent to the formation of the second metal layer in the single-step deposition procedure. That is, in the single-step deposition procedure, the ARC-TiN layer is deposited to the full thickness when the temperature stabilization time ST has elapsed after the formation of the metal layer.

Figure 6:
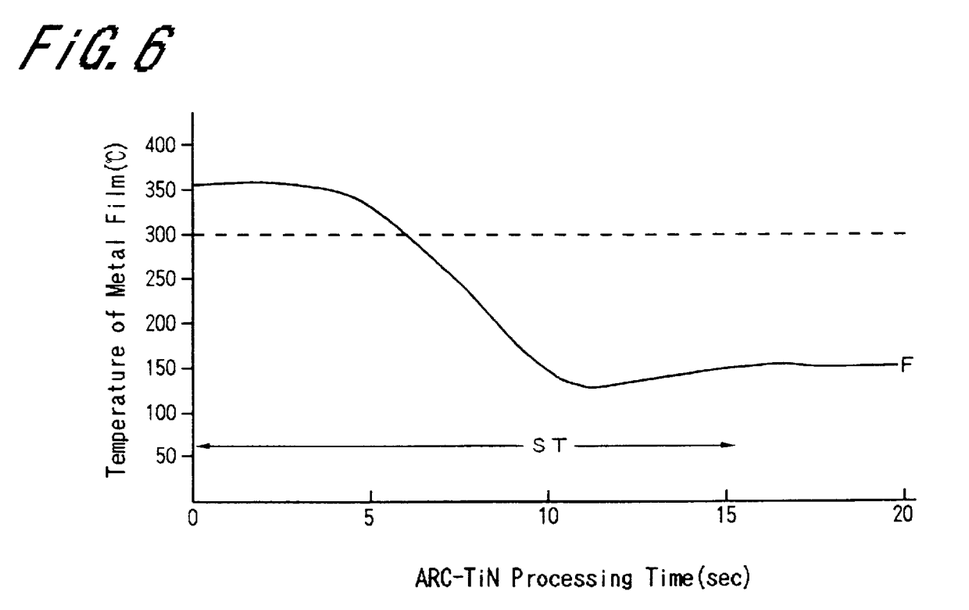
FIG. 6 is a graph showing temperature change in time of a metal layer.

FIG. 6 shows the temperature of a metal layer as a function of the processing (deposition) time for the anti-reflective layer. FIG. 6 corresponds to a section of FIG. 5 indicated by "ST". The coordinate represents the temperature (in ° C.) of the metal layer, and the abscissa represents the processing time (in second) for the ARC-TiN layer. The second predetermined deposition temperature is set to 150° C. in this example. The temperature of the metal layer is measured after the transfer time X. As shown in FIG. 6, the temperature of the metal layer is 360° C. at the beginning of ARC-TiN layer deposition, but it drops to 340° C. after 5 second and to 150° C. after 10 seconds, and remains at substantially the same temperature of 150° C. thereafter.

From this data for the case of second predetermined deposition temperature of about 150° C., the temperature stabilization time ST is determined to be about 15 second. Thus, the single-step deposition procedure was tested for ST=15 seconds, and for 5 seconds and 40 seconds as well to compare the cases with the case of ST=15, as shown in Table 1. On the other hand, the anti-reflective layer of the invention is formed in the step 2 of the multi-step deposition procedure over a period of 60 seconds, so that it is believed that the second metal layer has been already cooled to the second predetermined deposition temperature of 150° C.

Figure 7:
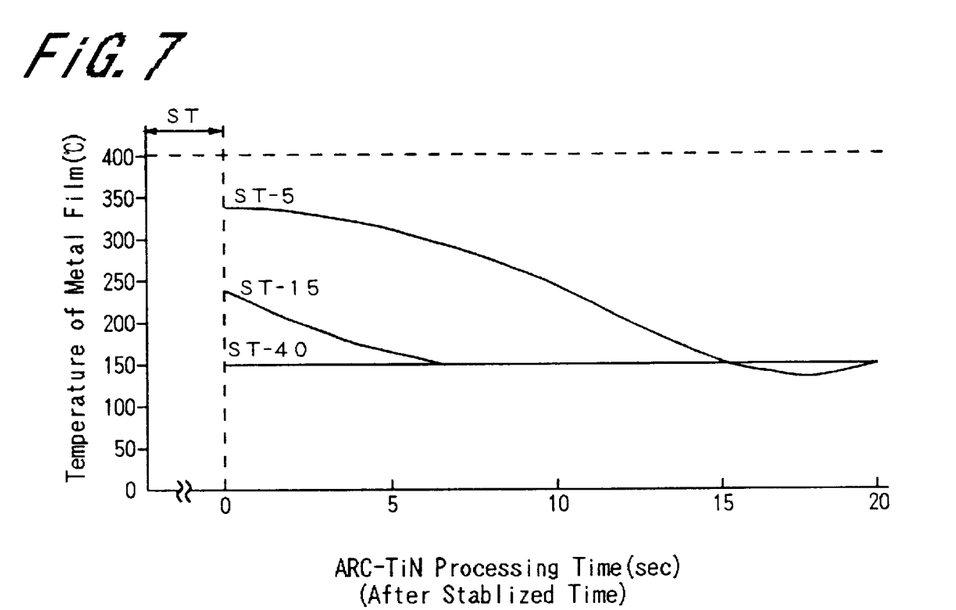
FIG. 7 is a graph showing various temperature changes in time of a metal layer for different temperature stability times based on a single-step deposition method.

FIG. 7 is a graph showing the temperature of the second metal layer plotted against the ARC-TiN layer deposition time for different values of ST. The three curves indicated by ST-5, ST-15, and ST-40 represent the cases of ST=5, ST=15, and ST=40, respectively.

In the case of ST-5, the temperature of the metal layer is 360° C. at the beginning of the ARC-TiN deposition (i.e. after the transfer time X=5 seconds). It drops to 310° C. after 5 seconds, to 240° C. after 10 seconds. After 15 seconds, it drops to 150° C., which is the second predetermined deposition temperature. The temperature remains at 150° C. thereafter 20 seconds later.

In like manner, in the case of ST-15, for which the transfer time X is 15 seconds, the temperature of the metal layer changes from the initial temperature of 340° C. to 160° C. after 5 seconds, and to 150° C. after 10 seconds. No change is observed thereafter.

In the case of ST-40 for which the transfer time X is 40 seconds, the temperature of the metal layer is already cooled to 150° C. when the deposition of the anti-reflective layer is started. The wafer maintains this temperature thereafter.

(Evaluation of the Depositions)

Table 1 lists the number of defective patterns, grooves, and insulation property observed in the sampled semiconductor devices which were obtained by means of the conventional single-step deposition procedure and the multi-step deposition procedure of the invention.

TABLE 1

| | Total Number of Faults | Etch residues (hillock-like) | Etch residues (Space) | Number of Grooves | Yield in Bridge Test |
|---|---|---|---|---|---|
| ST = 5 seconds | 53 | 16 | 1 | 35 | — |
| ST = 15 seconds | 1414 | 2 | 0 | 297 | 0–20% |
| ST = 40 seconds | 5945 | 10 | 0 | 287 | — |
| Multi-Step Deposition | 7 | 1 | 0 | 6 | 24–80% |

The "total number of faults" shown in Table 1 represents the number of defective patterns or faults per unit area as observed by a scanning electron microscope. Of these faults typical ones are "etch residues (Hillock configuration)", which are portions of the metal layer not etched and protruding from the patterned lead lines, and "etch residues (spaces)" represents portions of the metal layer not etched sufficiently and remaining in the spaces between adjacent patterned lead lines, "number of grooves" represents the number of the grooves formed.

Figure 8:
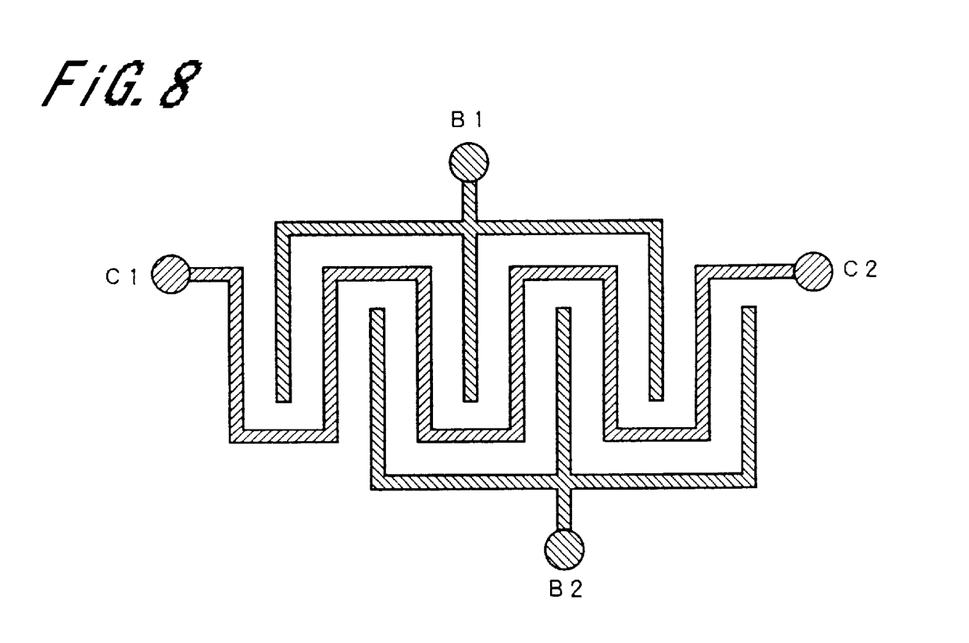
FIG. 8 is a bridge pattern for use in a bridge test.

The "yield in bridge test" represents the percentage of those samples that were provided with patterned lead lines as shown in FIG. 8 and passed a leak test in which leakage current is less than a predetermined level.

The lead line pattern shown in FIG. 8 has a pair of comb-shaped electrodes B1 and B2 formed by patterning the second metal layer in this shape and a further electrode C1–C2 extending between the electrodes B1 and B2. The distances between the electrode C1–C2 and the electrodes B1 and B2 are 0.72 micrometers and the length of electrode C1–C2 is 4.33 meters.

In the bridge test, the electrode C1–C2 is supplied with 5 Volts and a current of 1 mA, with the two electrodes B1 and B2 set to zero Volts. A leakage current is measured between one of the electrode B1 and B2 and the electrode C1–C2.

To elucidate the advantage of the multi-step deposition procedure of the invention over the conventional single-step deposition procedure, allowable leakage current level was set to "$1 \times 10^{-9}$ A or less" in the bridge test, which is much more stringent than commercially acceptable leakage level. The yields shown in Table 8 indicates the percentage of the patterned electrodes that passed this severe test.

As seen in Table 1, the total numbers of faults observed in the single-step deposition samples were, on the average, 53, 1414, and 5945 for ST=5, ST=15, and ST=40 seconds, respectively. On the other hand, the total number of faults observed in the multi-step deposition samples was 7, which manifests that the faults are extremely reduced in the multi-step deposition procedure. Of these faults, the number of Heroc faults were 16, 2, and 10 for three different cases in the single-step deposition procedure, but it was 1 in the multi-step deposition procedure. The etch residues (space) counted 1, 0, and 0 in the former cases, but it was 0 in the latter case.

The numbers of grooves were 35, 297, and 287 for the three single-step deposition cases, but the number was only 6, showing again significant reduction of the faults in the method of the present invention.

Although the bridge tests were performed only for ST=15 seconds in the single-step deposition case, the yield was in the range of 0–20%, while the yield was in the range of 24–80% in the case of the present invention.

From the comparison of the multi-step deposition method of the invention with the conventional single-step deposition method, it is concluded that the invention may reduce the total number of faults, particularly grooves, and that the invention may provide improved inter-lead line insulation.

The invention may provide a novel method of manufacturing semiconductor devices.

The invention may provide a novel method of manufacturing a semiconductor device in which a desirable multi-level lead line structure is formed.

The invention may provide a novel method of manufacturing a multi-layered semiconductor device in which ring faults and etch residues are substantially reduced, and hence may provide highly planarized surfaces to deposited layers and a well insulated multi-level lead line pattern suitable for the multi-level lead lines.

What is claimed is:

1. A method of manufacturing a semiconductor device, comprising steps of:

depositing an aluminum alloy layer on a semiconductor wafer;

depositing an anti-reflective layer on said aluminum alloy layer at a first deposition temperature, wherein the temperature of said aluminum alloy layer is controlled firstly at said first deposition temperature; and depositing a remaining portion of said anti-reflective layer on said aluminum alloy layer at a second deposition temperature, the temperature of said aluminum alloy layer being subsequently controlled by said second deposition temperature.

2. The method according to claim 1, wherein the temperature of said aluminum alloy layer is controlled by:

depositing said anti-reflective layer on said aluminum alloy layer only to a fraction of a thickness at a first predetermined deposition temperature under no intentional cooling, said deposition carried out before grooves due to lattice dislocations in said aluminum alloy become significant therein;

interrupting or retarding the growth of said anti-reflective layer until said aluminum alloy layer is intentionally cooled to a second Deposition temperature;

resuming the growth of said anti-reflective layer when said aluminum alloy is cooled to said second deposition temperature, until the thickness of said layer reaches said thickness.

3. The method according to claim 1, wherein said aluminum alloy layer and said anti-reflective layer are formed in succession in vacuum.

4. The method according to claim 1, wherein said aluminum alloy layer is substituted for by a metal layer having a larger thermal expansion coefficient than said anti-reflective layer.

5. A method of manufacturing a semiconductor device having a multi-level lead line structure, comprising steps of:

depositing at a first deposition temperature a metal layer for forming a lead line layer;

depositing, substantially at said first deposition temperature, on said metal layer an anti-reflective layer under a temperature gradient that decreases in the direction of the thickness of said anti-reflective layer such that the temperature of said anti-reflective layer adjacent said metal layer is substantially the same as said first deposition temperature; and depositing, at a second deposition temperature a remaining portion of said anti-reflective layer such that the temperature of said anti-reflective layer is the same as said second deposition temperature which is lower than said first deposition temperature.

6. A method of manufacturing a semiconductor device having a multi-level lead line structure, comprising steps of:

depositing at a first deposition temperature a metal layer for forming a lead line layer, and depositing an anti-reflective layer on said metal layer, wherein substantially no thermal stress due to a temperature gradient is left in the interface region between said metal layer and said anti-reflective layer, wherein said step of depositing said anti-reflective layer on said metal layer occurs with an initial portion of said anti-reflective layer being deposited at a first deposition temperature and a remaining portion of said anti-reflective layer being deposited at a second deposition temperature.

7. A method of manufacturing a semiconductor device having a multi-level lead line structure, comprising steps of:

depositing at a first deposition temperature a metal layer on a semiconductor wafer for forming a lead line layer; and depositing an anti-reflective layer on said metal layer in the following multi-deposition steps:

a anti-reflective layer is deposited on said metal layer at a first predetermined deposition temperature;

said metal layer bearing thereon said anti-reflective layer is cooled while interrupting or retarding the deposition of said anti- reflective layer until said metal layer is cooled to a second deposition temperature; and said anti-reflective layer is grown to a thickness by resuming the deposition at said second deposition temperature.

8. The method of manufacturing a semiconductor device according to claim 7, wherein steps of depositing said anti-reflective layer is carried out by means of Ar assisted sputter processing such that Ar gas is stopped on a heating side of said metal layer in said first stage of depositing said anti-reflective layer;

Ar gas is flown only on a heating side of said wafer for cooling of said metal layer to said second predetermined deposition temperature; and Ar gas are flown on a processing and heating sides of said wafer, respectively.

9. The method of manufacturing a semiconductor device according to claim 7, wherein said first deposition temperature is about 400° C.; and said second deposition temperature is about 150° C.

10. The method of manufacturing a semiconductor device according to any one of claims 5, 6, and 7, wherein said metal layer is one of aluminum and an aluminum alloy; and said anti-reflective layer is TiN.

* * * * *